United States Patent
Guy et al.

(10) Patent No.: US 10,296,679 B2
(45) Date of Patent: May 21, 2019

(54) METHOD FOR EXPLOITATION OF HYDROCARBONS FROM A SEDIMENTARY BASIN BY MEANS OF A BASIN SIMULATION TAKING ACCOUNT OF GEOMECHANICAL EFFECTS

(71) Applicants: TOTAL SA, Courbevoie (FR); IFP Energies nouvelles, Rueil-Malmaison (FR)

(72) Inventors: Nicolas Guy, Paris (FR); Daniele Colombo, Clamart (FR); Jeremy Frey, Le Vesinet (FR); Olivier Vincke, Sannois (FR); Claude Gout, Courbevoie (FR)

(73) Assignee: IFP ENERGIES NOUVELLES, Rueil-Malmaison (FR)

( * ) Notice: Subject to any disclaimer, the term of this patent is extended or adjusted under 35 U.S.C. 154(b) by 197 days.

(21) Appl. No.: 15/382,746

(22) Filed: Dec. 19, 2016

(65) Prior Publication Data
US 2017/0177764 A1    Jun. 22, 2017

(30) Foreign Application Priority Data

Dec. 17, 2015 (FR) .................................... 15 62666

(51) Int. Cl.
| | |
|---|---|
| *G06G 7/48* | (2006.01) |
| *G06F 17/50* | (2006.01) |
| *G01V 11/00* | (2006.01) |
| *E21B 41/00* | (2006.01) |
| *E21B 49/00* | (2006.01) |
| *G01V 1/28* | (2006.01) |

(Continued)

(52) U.S. Cl.
CPC ...... *G06F 17/5009* (2013.01); *E21B 41/0092* (2013.01); *E21B 49/00* (2013.01); *G01V 1/282* (2013.01); *G01V 11/00* (2013.01); *G06F 17/11* (2013.01); *E21B 43/24* (2013.01)

(58) Field of Classification Search
CPC .... G06F 17/5009; G01V 99/005; G01V 11/00
See application file for complete search history.

(56) References Cited

U.S. PATENT DOCUMENTS

| | | | | |
|---|---|---|---|---|
| 2011/0313745 | A1* | 12/2011 | Mezghani ............... | G01V 99/00 703/10 |
| 2013/0046524 | A1* | 2/2013 | Gathogo ................ | G01V 1/282 703/6 |

(Continued)

*Primary Examiner* — David Silver
(74) *Attorney, Agent, or Firm* — Fitch, Even, Tabin & Flannery LLP

(57) ABSTRACT

The invention is a method for exploitation of a sedimentary basin containing hydrocarbons using basin simulation. Based on a reconstitution of the formation of the first of the layers of the basin, a conjoint basin simulations of at least one of the layers underlying the first layer. A conjoint geomechanical simulation of the first layer and the at least one underlying layer is then carried out. If the deviation between some of at least some parameters from the geomechanical simulation and those from the basin simulation is above a predefined threshold, the previous steps are repeated applying a correction to the basin simulation. The basin is then exploited as a function of the results of the basin simulation. The invention applied to exploration and exploitation of the basin.

18 Claims, 2 Drawing Sheets

(51) Int. Cl.
 *G06F 17/11* (2006.01)
 *E21B 43/24* (2006.01)

(56) References Cited

U.S. PATENT DOCUMENTS

| | | | |
|---|---|---|---|
| 2016/0070024 A1* | 3/2016 | Berard | G01V 99/005 |
| | | | 703/10 |
| 2016/0103246 A1* | 4/2016 | Freeman | G01V 99/005 |
| | | | 703/10 |
| 2018/0024263 A1* | 1/2018 | Aarre | G01V 1/364 |
| | | | 367/43 |
| 2018/0031732 A1* | 2/2018 | Mosse | G01V 1/50 |

\* cited by examiner

METHOD FOR EXPLOITATION OF HYDROCARBONS FROM A SEDIMENTARY BASIN BY MEANS OF A BASIN SIMULATION TAKING ACCOUNT OF GEOMECHANICAL EFFECTS

CROSS-REFERENCE TO RELATED APPLICATION

Reference is made to French Patent Application No. 15/62.666 filed Dec. 17, 2015, which is incorporated herein by reference in its entirety.

BACKGROUND OF THE INVENTION

Field of the Invention

The present invention concerns the exploration and exploitation of hydrocarbon deposits or geological gas storage sites. The present invention more particularly concerns basin modeling applied notably to evaluating hydrocarbon potential of a sedimentary basin having a complex geological history.

Description of the Prior Art

Hydrocarbon exploration looks for hydrocarbon deposits in a sedimentary basin. The understanding of the principles governing the genesis of hydrocarbons and their links with the geological history of the subsoil have made it possible to develop methods for evaluation of the hydrocarbon potential of a sedimentary basin. The general approach to the evaluation of the hydrocarbon potential of a sedimentary basin includes to-and-from movements between a prediction of the hydrocarbon potential of the sedimentary basin, produced on the basis of available information concerning the basin under study outcrops, seismic campaigns, drilling, for example) and exploration drillings in zones having the greatest potential in order to confirm or to rule out the potential previously predicted and to acquire new data to be used in new, more accurate studies.

The exploitation of a hydrocarbon deposit selects the areas of the deposit having the greatest hydrocarbon potential based on information collected during the hydrocarbon exploration phase, defines optimum exploitation schemes for those zones (for example using a reservoir simulation in order to define the number and positions of the exploitation wells making possible optimum hydrocarbon recovery), and drills exploitation wells and sets up the production infrastructures necessary for the development of the deposit.

A sedimentary basin is the result of the deposition of sediment in a depression in the earth's crust over geological periods of time. These sediments, loose and rich in water, will be subjected during their progressive burial in the basin to pressure and temperature conditions that will transform them into compact sedimentary rocks, termed geological layers.

The present-day architecture of a sedimentary basin is notably the result of mechanical deformation of the subsoil over geological time periods. This deformation includes at the very least compacting of the geological layers due to the progressive burying of these layers in the basin because of the effect of new sediments. However, a sedimentary basin is also most often subjected to tectonic movements of large amplitude, generating upthrusts in the geological layers, for example, or even faults creating a rupture in the geological layers.

For its part, the nature of the hydrocarbons present in a sedimentary basin results in particular from the type of organic material present in the sediments that have been deposited, and also the pressure and temperature conditions to which the basin is subjected over geological time periods.

FIG. 1 is a diagrammatic representation of a sedimentary basin including a plurality of geological layers (a,c) limited by sedimentary interfaces (b) crossed by a fault line (e) and an accumulation (d) of hydrocarbons in one of the geological layers of the basin (c).

The formation of a sedimentary basin therefore involves a large number of complex physical and chemical processes, which are moreover able to interact. Faced with this complexity, the prediction of the hydrocarbon potential of a sedimentary basin requires computer tools making it possible to simulate as realistically as possible the physical and chemical phenomena involved in the formation of the basin being studied.

This type of reconstitution of the history of the formation of a sedimentary basin, also termed basin modeling, is most often carried out by a family of computer tools making it possible to simulate in one, two or three dimensions the sedimentary, tectonic, thermal, hydrodynamic and organic and inorganic chemistry processes that are operative during the formation of a basin.

Basin modeling conventionally includes three steps:

- a geo-modeling step which constructs a meshed representation of the basin under study. This meshed representation is most often structured in layers, that is a group of meshes is assigned to each geological layer of the modeled basin. Each mesh of this representation then has entered into it one or more petrophysical properties, such as porosity, facies (clay, sand, etc.) or again the organic material content. The construction of this model is based on data acquired from seismic campaigns, measurements in wells, core samples, etc.
- a step of structured reconstruction of the architecture of the basin which reconstructs the past architectures of the basin. To this end, the meshed representation constructed in the preceding step is deformed in order to represent the chronological evolution of the architecture of the subsoil during geological time periods, for different time periods which are also known as time steps.
- a basin simulation step which is a numerical simulation of a selection of physical and chemical phenomena occurring during the evolution of the basin and contributing to the formation of the petroleum traps. This basin simulation is performed time step by time step which relies for each time step on the meshed representations constructed for each time step in the preceding step. In particular, a basin simulation supplies a predictive mapping of the subsoil indicating the probable location of the deposits together with the concentration, nature and pressure of the hydrocarbons trapped therein.

By supplying quantitative and reliable information, this integrated basin modeling approach makes possible increasing the success rate when drilling an exploration well.

Generally speaking, a sedimentary basin may be subjected over its history to mechanical stresses characterized by components in three dimensions in space. These stresses are local or regional and variable over time and are on the one hand induced by the sediment deposits themselves. In this case, the mechanical stresses include a vertical component linked to the weight of the sediments on the layers already deposited but most often also include a horizontal component with the sedimentary deposits generally not being invariant laterally. On the other hand, throughout its formation, a sedimentary basin is subjected to mechanical stresses induced by tectonic movements linked to terrestrial geodynamics, such as movements in extension (causing the opening of the basin with the formation of a rift, for example) or movements in compression (causing thrusts and upthrusts in the basin, etc.). These tectonic movements most often induce variations of mechanical stresses in three dimensions in space. It should be noted that a layer already deposited will be subjected to variations of stresses induced by the tectonic movements to which a sedimentary basin is subjected throughout its formation.

Very conventionally, as described for example in the document (Schneider F., 2003), the basin simulation software assumes only vertical variations of the mechanical stresses affecting a sedimentary basin. To be more precise, the basin simulation software takes into account only the vertical component of the variations of mechanical stresses induced by the weights of the successive sedimentary deposits over time. This is referred to as 1D simulation of the mechanical effects.

By not taking into account the three-dimensional variations of the mechanical stresses, serious consequences can result in the evaluation of the hydrocarbon potential of a sedimentary basin can result. In fact, the horizontal mechanical stresses can for example generate fractures or upthrusts in the geological layers of the basin, which can greatly modify the characteristics of the petroleum deposits and the rocks covering these deposits and consequently their preferred flow paths, the pressure levels in the basin, the location of the hydrocarbon traps, etc.

Taking into account the variations in three dimensions of the mechanical stresses to which a sedimentary basin is subjected during its genesis therefore appears to be important for a realistic prediction of the hydrocarbon potential of the basin, all the more so when that basin has a complex geological history.

The following documents will be cited in the description:

Nayroles, B., G. Touzot and P. Villon. 1991. The Diffuse Approximation. C. R. Acad. Sci., Paris, series II. 313: 293-296.

Scheichl, R., Masson, R., Wendebourg, J., Decoupling and Block Preconditioning for Sedimentary Basin Simulations, Computational Geosciences 7(4), pp. 295-318, 2003.

Schneider F., Modelling Multi-Phase Flow of Petroleum at the Sedimentary Basin Scale. Journal of Geochemical exploration 78-79 (2003) 693-696.

Schneider, F., S. Wolf, I. Faille, D. Pot, A 3D Basin Model for Hydrocarbon Potential Evaluation: Application to Congo Offshore, Oil & Gas Science and Technology—Rev. IFP, Vol. 55 (2000), No. 1, pp. 3-13.

Steckler, M. S., and A. B. Watts, Subsidence of the Atlantic-Type Continental Margin off New York, Earth Planet, Sci. Lett., 41, 1-13, 1978.

Zoback, M. D., Reservoir Geomechanics, 2010.

Zienkiewicz, O. C., R L Taylor and J Z Zhu, The Finite Element Method: Its Basis and Fundamentals (seventh ed.), 2013.

U.S. Pat. No. 8,271,243 discloses co-operation between a basin simulation and a geomechanical simulation for accounting for three-dimensional geomechanical effects in basin modeling.

Geomechanical modeling, as applied to the field of evaluating the hydrocarbon potential of a sedimentary basin, conventionally uses histories of pressure, temperature and saturation, quantities of sediments deposited or eroded, tectonic stresses where applicable, and laws of behavior associated with the various lithologies of the domain being modeled, in order to describe the geomechanical behavior of a basin over geological time periods.

Geomechanical modeling generally comprises two phases:

A geo-modeling phase of the constructs a meshing of the sedimentary basin to be studied. As in basin simulation, this meshed representation is most often structured in layers, with a group of meshes being assigned to each geological layer of the modeled basin. Each mesh of this meshed representation is then associated with, for example, a geomechanical behavior law, a porosity, a pressure, a stress or a density. The construction of this model is based on data acquired from seismic campaigns, measurements in wells, core samples, etc. For reasons linked to the numerical solution of the equations involved in basin simulation and in geomechanical simulation, a meshed representation suitable for a basin simulation may be different from a meshed representation suitable for a geomechanical simulation.

A step of numerical geomechanical simulation, which makes possible calculation of the evolution over time of the distribution of stresses in each of the meshes of the meshed representation together with the resulting deformations. This type of technique is used in the petroleum industry, but is also used in the geotechnical field, for example. To this end geomechanical simulators employ a meshed representation as described above and solve the equation for the conservation of the quantity of movement in a discrete manner using the finite element method. This technique notably makes it possible to predict the stress variations in three dimensions in space.

U.S. Pat. No. 8,271,243 describes a method based on cooperation between a basin simulation and a geomechanical simulation. In this approach the three-dimensional geomechanical stress variations to which a given layer is subjected is determined only once during its deposition. In other words, the approach as described ignores the three-dimensional geomechanical effects resulting from the deposition of subsequent layers or of tectonic movements affecting the basin after the deposition of this layer.

This way of accounting for the evolution of the three-dimensional geomechanical stresses during the creation of a sedimentary basin is therefore unsatisfactory if that basin is characterized by deposits that are variable laterally (inducing horizontal stress variations, not just vertical ones) and is subjected to tectonic stresses (generally including a non-zero horizontal component). A notable possible result of this is a deviation in the final estimation of the pore pressures and the fluid saturations in each of the meshes of the meshed representation representative of the present time and obtained after using the method according to the U.S. Pat. No. 8,271,243. Now, an accurate knowledge of this information is crucial for the hydrocarbon evaluation of a sedimentary basin (for example the decision to exploit a given sedimentary basin is notably based on the knowledge of the hydrocarbon saturation of that basin) and its exploitation (for example the decision to use such or such a petroleum exploitation scheme is based on the knowledge of the pore pressures in the basin).

SUMMARY OF THE INVENTION

The present invention accounts for in a basin simulation of the three-dimensional geomechanical effects to which a layer is subjected during its deposition and also of the three-dimensional geomechanical effects generated by the deposition or the erosion of that layer on the underlying layers already deposited. Moreover, the invention also makes possible taking tectonic stresses into account. Thus, the present invention improves prediction of the quantities predicted by a basin simulation, notably the pore pressures and the fluid saturations.

The present invention therefore concerns a method for exploiting a sedimentary basin containing hydrocarbons, comprising a reconstitution of the formation of the basin, the formation comprises at least the deposition of two sedimentary layers, the reconstitution being carried out a basin simulator and a geomechanical simulator cooperating with one another, by use of measurements of properties relating to the basin and meshed representations representative of the basin at the time of the deposition of each of the sedimentary layers. On the basis of the measurements and a reconstitution of the formation of the first of the layers, the reconstitution for at least one of the layers underlying the first layer is implemented according to at least the following steps:

A. using the basin simulator to simulate a conjoint basin of the layer and of at least one layer underlying the layer and determining a first of parameters;
B. performing a conjoint geomechanical simulation based on at least a part of the first set of the parameters and the geomechanical simulator and of at least one layer underlying the layer, and determining a second set of parameters;
C. measuring a deviation between at least a part of the parameters of the first set and at least a part of the parameters of the second set. Steps A) to C) are executed iteratively applying a correction to the basin simulation if the deviation is above a predefined threshold.

Then, by use of the reconstitution carried out on the layers, selecting at least one zone of the basin including the hydrocarbons and exploiting the basin as a function of the selected zone.

According to one embodiment of the invention, the reconstitution relating to the first layer may be carried out according to at least the following steps:

i. performing a basin simulation by use of the basin simulator which relates to the first layer and determining a first set of parameters;
ii. based on at least a part of the first set of parameters and the geomechanical simulator, simulating the first layer and determining a second set of parameters;
iii. measuring a deviation between at least a part of the parameters of the first set and at least a part of the parameters of the second set and executing steps i) to iii) iteratively to apply a correction to the basin simulation if the deviation is above a predefined threshold.

According to one embodiment of the invention, the first set of parameters may include at least the porosity and the pressure in each of the meshes of the meshed representation.

According to one embodiment of the invention, the second set of parameters may include at least the porosity in each of the meshes of the meshed representation.

The deviation may preferably be based on a measurement of the difference between the porosity from the first set and the porosity from the second set.

The deviation may advantageously be an absolute deviation $MES^{abs}$ defined according to a formula:

$$MES^{abs} = \max_{n \in N}(|\varphi_n^g - \varphi_n^b|)$$

where $\varphi_n^b$ (respectively $\varphi_n^g$) corresponds to the porosity determined by the basin simulator (respectively by the geomechanical simulator) in a mesh n of the meshed representation comprising N meshes.

According to one embodiment of the invention, the deviation may be a relative deviation $MES^{rel}$ defined according to a formula:

$$MES^{rel} = \frac{2 \times \max_{n \in N}(|\varphi_{n,}^g - \varphi_{n,}^b|)}{\varphi_n^g + \varphi_n^b}$$

where $\varphi_n^b$ (respectively $\varphi_n^g$) corresponds to the porosity determined by the basin simulator (respectively by the geomechanical simulator) in a mesh n of the meshed representation comprising N meshes.

According to one embodiment of the invention, the method may include a step of simulating at least one of erosion of at least one of the layers and simulating a geological disconformity.

The invention further concerns a computer program product that can be downloaded from a communication network and/or stored on a non-transient computer-readable medium and/or executed by a processor, comprising program code instructions for executing the method according to the above description when the program is executed on a computer.

Other features and advantages of the method according to the invention will become apparent on reading the following description of nonlimiting embodiments with reference to the appended figures described hereinafter.

DETAILED DESCRIPTION OF THE INVENTION

Figure 1:
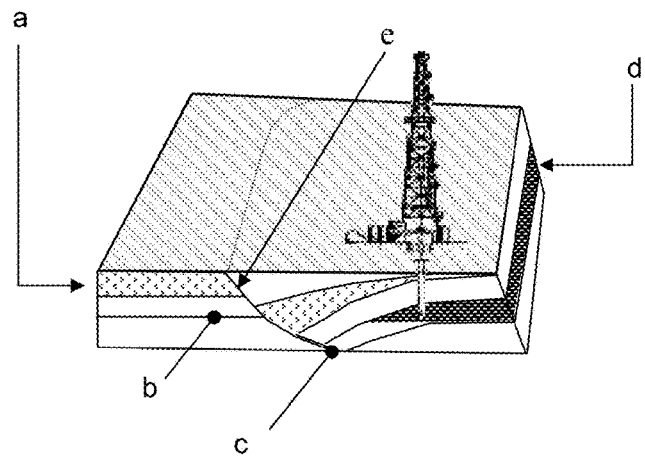
FIG. 1 is a diagrammatic representation of the subsoil of a petroleum basin.

The invention relates to a method for exploitation of a sedimentary basin containing hydrocarbons and notably the identification of at least one zone of the basin in which hydrocarbons have been able to accumulate, for the purpose of extraction of those hydrocarbons.

The invention concerns a realistic reconstitution of formation of a sedimentary basin resulting from deposition of at least two sedimentary layers, the reconstitution of at least the second layer being produced via a basin simulator and a geomechanical simulator cooperating with one another. Hereinafter the deposition of a sedimentary layer is considered to correspond to a time period (or time step) of a simulation. However, a time period for simulation may nevertheless also correspond to the erosion of a sedimentary layer or to a geological disconformity. According to the invention, based on the reconstitution of the formation of a first layer (for example the layer deposited first in the basin), there a reconstitution for a layer underlying the first layer is carried out a reconstitution for a layer underlying the first layer by applying at least one basin simulation and one geomechanical simulation for the underlying layer conjointly with at least one underlying layer (that is a layer already deposited, such as the first layer, for example) of that basin.

The present invention requires:

measuring properties relating to the basin which are measurements carried out in situ (for example by core sampling, logging in wells, seismic acquisition campaigns, etc.), at different points in the basin under studied, necessary for a basin simulation and a geomechanical simulation, such as the porosity, permeability or lithology at the present time. According to one embodiment of the invention to account for the three-dimensional stresses induced by tectonic movements, estimating the values of the stresses in situ and their orientation in space. These estimates may be obtained from leak-off tests, for example, mini-frac (see for example Zoback, 2010) and analysis of the ovalization of the wells. Another possible source of information is the geological analysis of the present geometry of the basin, which makes possible estimation of any tectonic extension and shortenings, ideally to arrive at a pertinent kinematic scenario.

a basin simulator which is software making possible a numerical basin simulation using a computer. To be more precise, a basin simulator makes it possible to simulate numerically the evolution (which includes the genesis and the migration) of the fluids (hydrocarbons but also the water of formation) in the basin being studied and their properties (evolution of the fluid pressures, saturations and temperatures), together with the evolution of the petrophysical properties of the rocks constituting the sedimentary layers of the basin under studied (notably the porosity and the permeability). According to the invention, a basin simulation is carried out using the basin simulator for a succession of time periods (also termed time steps), with each period corresponding to a geological event, such as the deposition or the erosion of a sedimentary layer, or a geological disconformity. According to the invention, the basin simulator requires meshed representations of the basin for each time step of the simulation (the construction of such meshed representations will be described during the description given hereinafter of the steps 1 and 2). The basin simulation therefore solves a system of differential equations describing the evolution over time of the physical magnitudes under studied. To this end, discretization by the finite volumes method may be used, for example, as described in (Scheichl et al., 2003). In accordance with the principles of the finite volumes methods centered on the meshes, the unknowns are discretized by a constant value per mesh and the equations of conservation (of mass or heat) are integrated in space over each mesh and in time between two successive time steps. The discrete equations then express the fact that the quantity conserved in a mesh at a given time step is equal to the quantity contained in the mesh at the preceding time step plus the quantity flows entering the mesh and minus the quantity flows leaving the mesh via its faces, also external inputs. In each time step and in each mesh of the meshed representation of the basin for the time step concerned, the basin simulator required for implementation of the invention makes it possible at least to calculate the following physical quantities: pore pressure and porosity. Basin simulation preferably also determines the temperatures and the saturations. One example of a basin simulator of this type is the TemisFlow™ software from IFP Énergies nouvelles, France.

a geomechanical simulator is a program making possible a numerical geomechanical simulation using a computer. To be more precise, a geomechanical simulator makes possible simulation of the evolution of the stresses and deformations in a sedimentary basin as it is formed. The geomechanical simulation necessitates a meshed representation of the basin under studied for each period (or time step) of the history of the basin for which production of an estimate of the geomechanical effect is desired. According to one embodiment of the present invention, the geomechanical simulation is based on a discretization and a solution of the equation for the conservation of the quantity of movement by the finite elements method (see for example Zienkiewicz et al., 2013). In this case, and if the meshed representation for the basin simulation is suitable for solution by the finite volumes method, a meshed representation suitable for the geomechanical simulation can be determined from a meshed representation suitable for the basin simulation by a remeshing process. The remeshing step may cut any degenerate hexahedra that may be present in the meshing suitable for solution by the finite volumes method into tetrahedra suitable for a solution by the finite elements method. In the case of meshed representations differing between basin simulation and geomechanical simulation, the correspondence between the two meshed representations may also be arrived at via a so-called mapping algorithm. The geomechanical simulator according to the invention requires at least one pore pressure value for each time step and in each mesh of the meshed representation relating to the time step concerned which makes possible calculation of at least the tensor of the stresses and the tensor of the deformations in each of the meshes of the meshed representation from an initial state defined in terms of stresses, pressures and porosities. Moreover, each mesh of the meshed representation associated with a given time step is associated at least with a geomechanical behavior law. The geomechanical behavior law may be expressed by a Young's modulus, a Poisson coefficient, and at least one of an elastic limit and a hardening law, which parameters can be estimated based on the facies (clay, sand, etc.) present in the mesh concerned. According to one embodiment of the invention, the geomechanical simulator may additionally account for the boundary conditions, notably making it possible accounting for regional tectonic movements. One example of a geomechanical simulator of this kind is the ABAQUS™ software from Dassault Systèmes, France.

The present invention then includes at least the following steps:

1. Construction of meshed representations of the basin
2. Reconstitution of the formation of the basin
   2.1. Application of a basin simulation
   2.2. Application of a geomechanical simulation
   2.3. Consistency check
3. Exploitation of the sedimentary basin The principal steps of the present invention are described in detail below.

1. Construction of Meshed Representations of the Basin

The invention is based on a basin simulation cooperating with a geomechanical simulation. Consequently, the method according to the invention requires a meshed representation for each simulation time step concerned for the implementation of the invention, with a time step corresponding to the deposition of a sedimentary layer, a geological disconformity or the erosion of a sedimentary layer.

According to one embodiment of the invention, this step is carried out first by establishing a meshed representation of the basin under study at the present time (step 1.1) and then reconstructing the past architectures of the basin (step 1.2), working back from the present time to a geological time t before the present time. This particular embodiment of the invention is described in more detail below.

1.1 Construction of a Meshed Representation at the Present Time

A meshed representation is a maquette of the sedimentary basin generally represented on a computer in the form of a mesh or grid, with each mesh is characterized by one or more petrophysical properties relating to the basin, such as porosity, facies, permeability, etc. The construction of this model is based on data acquired from seismic campaigns, measurements in wells, core samples, etc.

More precisely, the construction of a meshed representation of a basin discretizes the architecture of the basin in three dimensions, assigns properties to each of the meshes of that meshed representation and adds boundary conditions of that representation to account for the interaction of the model area with its environment. To this end, notably used are the measurements of properties carried out at various points of the basin as described above, which are at least one of extrapolated and interpolated in the various meshes of the meshed representation according to more or less restrictive hypotheses.

Figure 2:
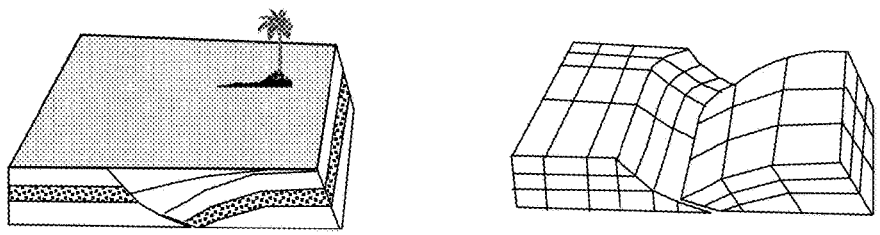
FIG. 2 shows an example of a sedimentary basin (on the left) and an example of a meshed representation of that basin (on the right).

The spatial discretization of a sedimentary basin is most often organized in layers of meshes each representing the various geological layers of the basin under study. FIG. 2 shows on the left an example of a sedimentary basin and on the right an example of a meshed representation of that basin.

The meshed representation which is usable for implementing the method, comprises in each mesh information on the lithology, a porosity value, a permeability value and properties relating to the fluids (notably the saturation). It is known to deduce from these quantities information relating to the compaction in each of the meshes of the meshed representation.

1.2 Structural Reconstruction

During this substep, reconstructing the past architectures of the basin is performed by, working back from the present time to a geological time t before the present time. To this end, the meshed representation constructed in the preceding step is deformed in order to represent the chronological evolution of the architecture of the subsoil during geological time periods and for each time step of the simulation. This produces a meshed representation for each time step of the simulation from the present time to the geological time t.

According to one embodiment of the present invention, the structural reconstruction may be particularly simple if it is based on the hypothesis the deformation is the result only of a combination of vertical movements by compaction of the sediment or by upheaval or deflection of its base. This technique, known as backstripping, is described in (Steckler and Watts, 1978), for example.

Figure 3:
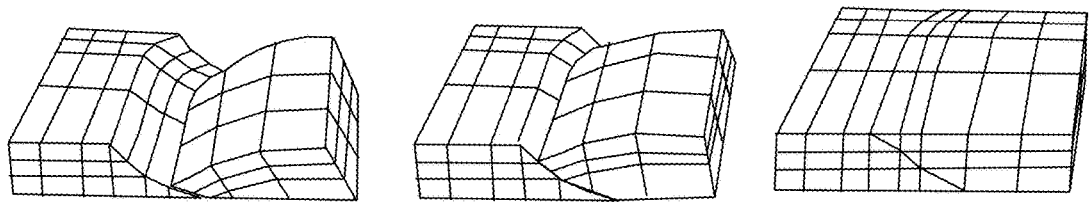
FIG. 3 shows the structural reconstruction of a sedimentary basin represented by three deformation states at three different time periods.

According to another embodiment of the present invention, in the case of basins with a complex tectonic history, notably basins including faults, it is necessary to use techniques with less restrictive hypotheses, such as structural restoration. One such structural restoration is described in the document French patent 2 930 350 corresponding to (US published application 2009/0265152 A), for example. The structural restoration calculates the successive deformations of the basin, integrating the deformations caused by compaction and those that result from tectonic forces. In FIG. 3 for example, three states are used to represent the deformation of the subsoil during geological time periods. The meshed representation on the left represents the present state, in which a slippage interface can be seen (here a fault). The meshed representation on the right represents the same sedimentary basin at a geological time t before the present time. At this time t the sedimentary layers were not yet fractured. The central meshed representation is an intermediate state representing the sedimentary basin at a time t' between the time t and the present time. It is seen that slippage has begun to modify the architecture of the basin.

2. Reconstitution of the Formation of the Basin

During this step, reconstituting the formation of the basin under studied is performed from the meshed representations established in the preceding steps by use of a basin simulator and a geomechanical simulator cooperating with one another.

To do this, it is necessary to have available beforehand a reconstitution of the formation of the first of the layers of the sedimentary basin under studied, that is the layer that was deposited in the basin first, or the oldest layer. This reconstitution of the first of the layers may be obtained by any means. According to one embodiment of the present invention, this reconstitution is obtained by a basin simulation.

Then, for at least one layer that was deposited after the first layer (that is a layer situated on top of the first of the layers), at least one basin simulation is applied followed by a geomechanical simulations. These simulations conjointly take into account the layer being considered and at least one layer underlying the layer being considered. The cooperation is assured by the transfer of some of the parameters to the geomechanical simulation on exiting from the basin simulation.

For a given layer, the basin simulation is preferably applied cooperatively with the geomechanical simulation for the layer being considered, conjointly with all the layers previously deposited (that is all the layers underlying the layer concerned).

According to the invention, the following substeps are therefore implemented for each layer being considered with the substeps 2.1 to 2.3 are repeated for at least each layer being considered:

2.1. Application of a Basin Simulation

During this substep, it is a basin simulation is performed with a basin simulator to the layer being considered, conjointly with at least one underlying layer, that is a layer already deposited. The conjoint basin simulation of a plurality of sedimentary layers makes possible accounting for the stresses imposed by the deposition of the overlying layers on the underlying layers.

The basin simulation according to the invention therefore makes it possible to calculate parameters for the layer being considered and also to updating parameters calculated for the layer previously deposited and considered conjointly with the current layer.

According to the invention, the basin simulation for the layer being considered is implemented using the meshed representation determined during the preceding step 2 for the time period corresponding to the deposition of the current layer. According to one embodiment of the invention, the meshed representation that is required contains in each mesh the usual basin simulation information, such as petrophysical properties relating to the lithology, information characterizing the type of compaction, properties relating to the fluids present in the formation at the time period being considered, as well as the limits and geometries of the layers already deposited.

According to one embodiment of the invention, the basin simulator used to implement the present invention makes it possible to discretize and solve the equations described in the document (Schneider et al., 2000). The TemisFlow™ software from IFP Énergies nouvelles, France is one example of a basin simulator of this kind.

After applying the basin simulation for the time period being considered, a first set of parameters is obtained such as pore pressures, saturations, temperatures, porosities in each of the meshes of the meshed representation of the period being considered. According to the invention, this first set of parameters comprises at least the porosities in each mesh of the meshed representation for the period being considered. According to one embodiment of the invention, this first set of parameters comprises at least the pore pressures and the porosities in each mesh of the meshed representation for the period being considered.

2.2. Application of a Geomechanical Simulation

During this substep, a geomechanical simulation is produced for the same time period being considered for the preceding substep. According to the invention, the geomechanical simulation is conjointly applied to the layer deposited during the current period and at least one other layer deposited in an earlier time period. The conjoint geomechanical simulation of a plurality of sedimentary layers makes it possible to account for the mechanical stresses imposed by the deposition of the overlying layers on the underlying layers.

The geomechanical simulation will preferably be applied to all the layers deposited up to the time period being considered. In other words, the geomechanical simulation at a given time period is carried out including all the column of sedimentary layers already deposited up to that period. In this way, the method according to the invention makes it possible to simulation of not only the three-dimensional geomechanical effects produced in the layer deposited during the time period being considered but also the effects produced in all the layers already deposited up to the time period being considered.

According to the invention, the geomechanical simulation is based on a meshed representation of the basin for the time period being considered. According to one embodiment of the invention, this may be the meshed representation used for the basin simulation when carrying out the preceding substep, possibly adapted to suit the method of solving the equations required by the geomechanical simulation as described above.

According to the invention, a portion of the first set of parameters calculated in the preceding substep for the same time period is sent to the geomechanical simulator. According to one embodiment of the invention, a portion of the first parameters calculated in the preceding substep corresponds to the pressure at the start and at the end of the time period being considered (termed the history of pressures) by the basin simulation. This history of pressures can then be used as a condition for the geomechanical simulation relating to the time period being considered. According to another embodiment, the geomechanical simulation is also sent at least one of the temperatures and saturations determined by basin simulation in the preceding substep. According to one embodiment of the invention, in the case of meshed representations differing between basin simulation and geomechanical simulation, the communication between the two meshed representations may be established via a so-called mapping algorithm.

The geomechanical simulation preferably also takes into account mechanical stresses linked to the regional tectonic movements to which the sedimentary basin under consideration has been subjected. According to one embodiment of the invention, these mechanical stresses are taken into account as boundary conditions during geomechanical simulations, for example imposing on the geomechanical simulation the verification at the edges of the simulation domain of the horizontal movements (reflecting a compression or an extension). Taking into account such boundary conditions can be done using the finite elements method via the use of conditions at the limits in movement or stresses. According to this embodiment, the meshed representation for the time period being considered is therefore deformed during the geomechanical simulation step, respecting the boundary conditions that have been established.

Following this substep, there is obtained a second set of parameters relating to the time period being considered. According to one embodiment of the invention, this second set of parameters comprises at least the porosities in each mesh of the meshed representation for the period being considered. Note that the meshed representation at the end of a time step of a geomechanical simulation is not necessarily identical to the meshed representation from the structural reconstruction step and determined during step 2 for the next time step.

2.3. Consistency Check

During this step, a consistency check is performed between at least some of the parameters of the first set of parameters determined in the step 2.1 by basin simulation and at least some of the parameters of the second set of parameters determined in the step 2.2 by geomechanical simulation. To this end, according to the invention, a deviation is measured between at least some of the parameters of the first set (from the basin simulation) and at least some of the parameters of the second set (from the geomechanical simulation). It is then verified whether that deviation is or is not beyond a predefined threshold.

According to one embodiment of the invention, the deviation is evaluated by comparing the porosities estimated by basin simulation and the porosities estimated by geomechanical simulation. The deviation can be estimated mesh by mesh if the basin and geomechanical models have identical meshings; if not, a field transfer technique which is well known is used. A reference to such a technique of this kind can be found in the document (Nayroles et al., 1991) for example.

According to one embodiment of the invention, for the time step t under consideration, a deviation $MES_t$ is calculated using a formula:

$$MES_t^{abs} = \max_{n \in N}(|\varphi_{n,t}^g - \varphi_{n,t}^b|) \tag{1}$$

where $\varphi_{n,t}^b$ (respectively $\varphi_{n,t}^g$) is the porosity determined by basin simulation (respectively by geomechanical simulation) into a mesh n of the meshed representation relating to the time step t, the meshed representation comprising N meshes. Note that if the geomechanical simulator does not determine the porosity directly, the latter can be obtained, using the formula: $\varphi_{me} = (V_T - V_S)/V_T$ where $V_T$ corresponds to the total volume of the mesh and $V_s$ to the solid volume in the mesh. According to this embodiment, the porosity predictions are considered to be consistent between geomechanical simulation and basin simulation for the time step t being considered if the deviation between these two predictions is below a threshold value predefined in a known manner. The predefined threshold value may advantageously be between 0.0001 and 0.02 inclusive. The porosity predictions are preferably considered to be consistent between geomechanical simulation and basin simulation for the time step t considered if $MES_t \leq 0.001$.

According to another embodiment of the invention, a relative deviation $MES_t^{rel}$ is calculated on the formula:

$$MES_t^{rel} = \frac{2 \times \max_n (|\varphi_{n,t}^g - \varphi_{n,t}^b|)}{\varphi_{n,t}^g + \varphi_{n,t}^b}.$$

According to this embodiment, the porosity predictions are considered consistent between geomechanical simulation and basin simulation for the time step t being considered if the deviation between these two predictions is less than a value predefined in a known manner. The predefined threshold value may advantageously be between 0.0001 and 0.02 inclusive. The porosity predictions are preferably considered consistent between geomechanical simulation and basin simulation for the time step t being considered if $MES_t^{rel} \leq 0.001$.

According to the invention, if the consistency criterion is not verified, a correction is estimated for use in starting a new basin simulation, which is executed for the same time step. The goal of this correction is to force the results of the geomechanical simulation and the results of the basin simulation to converge.

According to one embodiment of the invention, this correction may be a correction of at least one of the permeabilities and the stresses to be applied in each of the meshes of the meshed representation relating to the time step being considered before the application of a new basin simulation.

Figure 4:
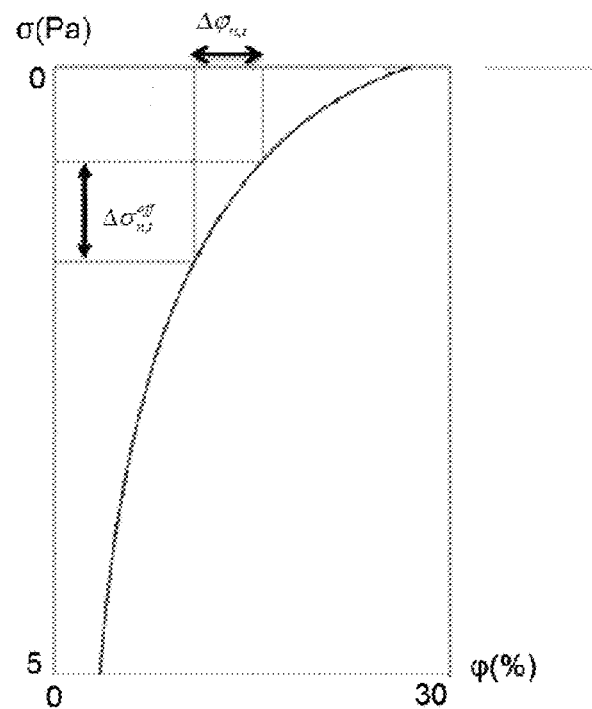
FIG. 4 shows a curve representing the evolution of the effect of stress as a function of porosity.

According to one embodiment of the invention, a stress correction is applied in each of the meshes of the meshed representation at the time that step t is estimated using the difference between the porosities calculated by the basin simulator and by the geomechanical simulation, as well as a sedimentary deposit compaction law. According to one particular embodiment of the invention, a compaction law f is considered linking effective stresses and porosities and a stress correction $\Delta \sigma_{n,t}^{eff}$ is calculated which is applied upon starting the basin simulation for a time step t with a mesh n being according to a formula:

$$\Delta \sigma_{n,t}^{eff} = f^{-1}(\varphi_{n,t}^g) - f^{-1}(\varphi_{n,t}^b), \qquad (2)$$

where f represents a sedimentary deposit compaction law, which may be of the type:

$$f(\sigma_{n,t}^{eff}) = \varphi_0 + \varphi_a \exp(-\sigma_{n,t}^{eff}/\sigma_a) + \varphi_b \exp(-\sigma_{n,t}^{eff}/\sigma_b), \qquad (3)$$

where $\varphi_0$, $\varphi_a$, $\varphi_b$, $\sigma_a$ and $\sigma_b$ are properties characterizing the compaction of the sediment being considered, which properties can determined from measurements of properties relating to the basin (see step 1). FIG. 4 notably shows how to determine from a compaction law f (continuous curve) and a porosity differential $\Delta \varphi_{n,t}$ an effective stress differential $\Delta \sigma_{n,t}^{eff}$ for a mesh n at a time step t. Accounting for stress corrections in a new basin simulation for the current layer has the effect of influencing the evolution of the porosity during the simulated period and therefore rapidly leading to convergence of the parameters from the basin simulation and from the geomechanical simulation.

According to another embodiment of the invention, a permeability correction is estimated for application in each of the meshes of the meshed representation at the time step t using estimates of the stresses obtained from the last geomechanical simulation and considerations of the geomechanical state of the materials determined from their porosity or from their state of deterioration or of fracturing. For example, this correction may lead to a significant increase in the permeability of a mesh that has reached a stress state that is critical with regard to the rupture criterion associated with its geomechanical behavior law. Taking permeability corrections into account in a new basin simulation for the time step being considered has the effect of influencing, among other things, the evolution of the pressures and overpressures, and therefore of leading to potentially more pertinent results. According to one embodiment of the invention, in the case of meshed representations differing between basin simulation and geomechanical simulation, the correspondence between the two meshed representations may be assured via a mapping algorithm.

According to another embodiment of the invention, there are estimated both a correction of permeabilities and a correction of stresses in each of the meshes of the meshed representation at the time step being considered. The accounting for of stress corrections and permeability corrections in a new basin simulation for the time step being considered has the effect of influencing the evolution among other things of the porosity, the pressures and overpressures and therefore of rapidly leading to the convergence of the parameters from the basin simulation and from the geomechanical simulation as well as to potentially more pertinent results.

According to the invention, if the consistency of the parameters of the two simulations is not verified, that is if the deviation between at least some of the parameters from the basin simulation and at least some of the parameters from the geomechanical simulation for the current time step is above a known predefined threshold, a correction is determined to be applied in the basin simulation and the substeps 2.1 to 2.3 are repeated until the deviation is below the threshold.

If not, according to the invention, once the consistency of the parameters of the two simulations has been verified, that is if the deviation between at least some of the parameters from the basin simulation and at least some of the parameters from the geomechanical simulation for the current time step is below the known predefined threshold, the substeps 2.1 to 2.3 described above are applied for the next time step.

This step therefore makes it possible to guarantee a realistic reconstruction of the basin.

3. Exploitation of the Sedimentary Basin

Following the application of the preceding step for each of the time periods of the reconstitution of the formation of the basin under study, general information is available such as:
i. the placement of the sedimentary layers,
ii. their heating during their burial,
iv. the modifications of fluid pressures resulting from that burial,
v. the formation of the hydrocarbons formed by thermogenesis,
vi. the movement of those hydrocarbons in the basin because of the effect of buoyancy, capillarity, pressure gradient differences, subterranean flows,
vii. the quantity of hydrocarbons resulting from thermogenesis in the meshes of each of the meshed representations of the basin,
viii. the evolution of the three-dimensional deformations and stresses during the formation of the basin.

Based on such information and notably on the information for the present time period, at least one area of the basin can be determined, corresponding to meshes of the meshed representation of the basin at the present time, containing hydrocarbons, as well as the concentration, nature and pressure of the hydrocarbons that are trapped there. Then selection of the areas of the basin under study having considered which have the greatest hydrocarbon potential is performed.

The petroleum exploitation of the basin may then take a number of forms, notably:
- carrying out exploratory drillings in the various areas selected as having the highest potential in order to confirm or to discount the potential estimated beforehand and to acquire new data for feeding new and more precise studies,
- carrying out exploitation drillings (producer or injector wells) for the recovery of the hydrocarbons present in the sedimentary basin in the area selected as having the highest potential.

Computer Program Product

The invention further concerns a computer program product that can be downloaded from a communication network and/or stored on a non-transient computer-readable medium and/or executed by a processor, comprising non-transitory program code instructions for executing the method as described above when the program is executed on a computer.

Variants

According to one embodiment of the present invention the reconstitution relating to the first layer of the sedimentary basin being considered is carried out according to a basin simulation cooperating with a geomechanical simulation. To be more precise, a basin simulation is performed relating to the first layer and a first set of parameters is determined. Then, based on at least some of the parameters of the first set and a geomechanical simulator, a geomechanical simulation is performed relating to the first layer and a second set of parameters is determined. A deviation is then measured between at least some of the parameters of the first set and at least some of the parameters of the second set (for example as described above in relation to the step 2.3). If this deviation is above a predefined threshold, a correction is calculated (for example a correction of stresses or of permeability, as described above in relation to the step 2.3) to be applied in a new basin simulation for the same first layer, followed by a geomechanical simulation. This process is continued until the measured deviation respects the predefined threshold.

According to one embodiment of the invention, the basin simulator and the geomechanical simulator used to carry out the steps 2.1 and 2.2 described above make possible where appropriate simulation of the erosion of at least one of the layers of the sedimentary basin being considered and to simulate a geological disconformity at a time period under considered. The simulations of at least one of erosion and disconformity are preferably carried out conjointly with at least one layer previously deposited and where applicable not affected by the erosion. The simulations of at least one of the erosion and a disconformity are preferably carried out conjointly on all the layers previously deposited and where applicable are not affected by the erosion. According to this last embodiment of the invention, the method according to the invention makes possible simulation of the evolution of the porosity, permeability, stress field and pressure field induced in the sedimentary basin under study by either total or partial erosion of a sedimentary layer of the basin of at least one under study and inducement by a geological disconformity.

Application Example

The features and advantages of the method according to the invention will become more clearly apparent on reading the following application example.

The method according to the invention was employed in the case of the formation of a sedimentary basin resulting from the deposition at varying speed of a series of layers containing clay over a period of 220 million years with the clay column is almost 6000 meters deep at the present time. In addition to the mechanical effects linked to the successive sedimentary deposits, this basin was subjected between 78 and 72 million years ago to an extensive tectonic phase (10% extension), generating three-dimensional mechanical stress variations.

Figure 5:
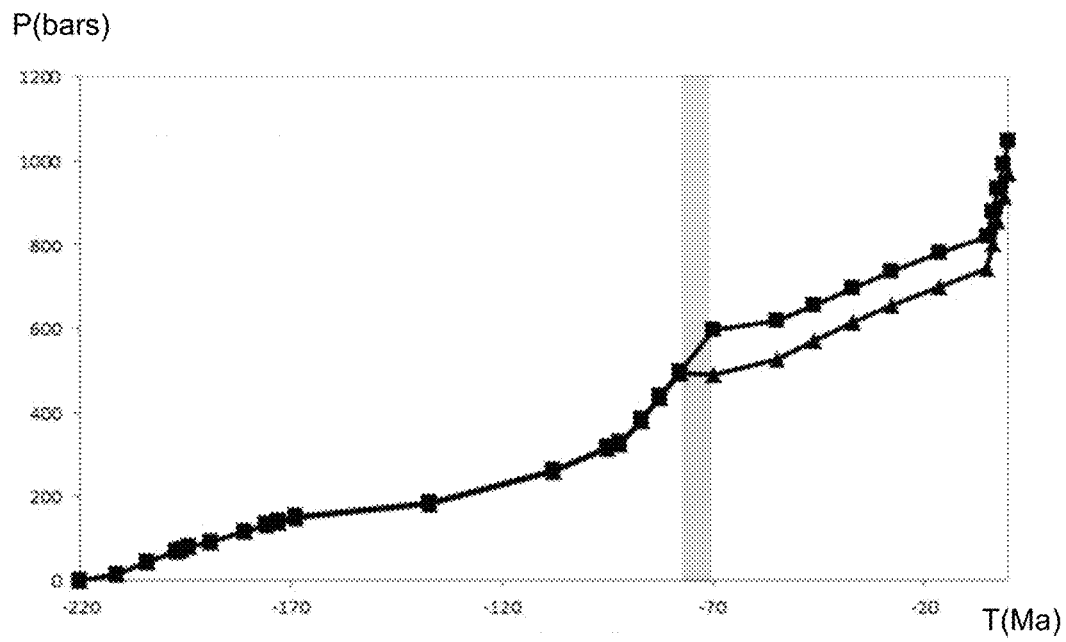
FIG. 5 compares the prediction of the evolution of the pore pressure in a sedimentary basin obtained by the method according to the invention and obtained by a prior art method.

FIG. 5 shows two curves which are:
- a first curve, plotted with squares, that corresponds to the evolution over geological time T of the pore pressure P predicted at the level of the first layer containing clay (that is the deepest layer) by the method of the invention, the latter taking into account the three-dimensional stress variations induced by the deposits later than the layer being considered and the stress variations stemming from tectonic movements. Moreover, the consistency check between the set of parameters from the basin simulation and the set of parameters from the geomechanical simulation described above in relation to the step 2.3 was carried out with a threshold value of 0.001;
- a second curve, plotted with triangles, that also corresponds to the evolution over geological time T of the predicted pore pressure P at the level of the first layer containing clay but by a prior art method which is a method accounting for neither the three-dimensional stress variations induced by the deposits after the layer being considered nor the stress variations resulting from tectonic movements that occurred after the deposition of the layer being considered.

It is seen in this figure that by accounting for the three-dimensional mechanical stresses for the deepest layer throughout the formation of the basin, it is possible to predict a pressure drop of 100 bar in the layer which was induced by the extensive tectonic episode (limited on the geological time axis by a shaded area) occurring after it was deposited. This tectonic phenomenon which occurred after the layer being considered was deposited is ignored by the prior art method, which leads to a prediction error with respect of the pore pressure of 100 bar in the layer being considered at the present time. An error of this kind can greatly negatively effects the assessment of the hydrocarbon potential of the layer. For example, might be judged that the pressures in the layer being considered are insufficient to enable cost-effective hydrocarbon extraction.

Taking into account the three-dimensional variations of the mechanical stresses to which a sedimentary basin is subjected throughout its formation therefore appears to be of fundamental importance for a true assessment of the hydrocarbon potential of a sedimentary basin.

The invention claimed is:

1. A method for exploiting a sedimentary basin to extract hydrocarbons from the basin which has a first layer and at least a second layer overlying the first layer comprising:
  constructing a meshed representation of at least the first and the second sedimentary layers of the basin with meshes including at least one measured property of the basin;
  performing a reconstitution of the first layer during geological time periods; and
  performing a reconstitution of the second layer during geological time periods using steps of:

A. using a numerical basin simulation to numerically jointly simulate over time evolution of the at least the first and second layers to generate a first set of parameters;

B. using geomechanical simulation to numerically jointly simulate over time evolution of stresses and deformations in at least the first and second layers based on at least part of the first set of parameters to generate a second set of parameters;

C. determining if a deviation exists between at least part of the determined parameters of the first set and part of the determined parameters of the second set;

D. if any deviation exists that exceeds a threshold, applying a correction to the numerical basin simulation and repeating steps A.-C. with the corrected basin simulation until a corrected basin simulation is produced having a deviation below the threshold;

using the corrected basin simulation having the deviation below the threshold to select at least one zone of the basin from which to extract hydrocarbons from the basin; and drilling at least one well into the selected at least one zone and using the at least one well as part of the extracting the hydrocarbons from the sedimentary basin.

2. The method as claimed in claim 1 wherein the first set of parameters includes at least porosity and pressure in each of the meshes of the meshed representation.

3. A method as claimed in claim 2 wherein the second set of parameters includes at least porosity in each of the meshes of the meshed representation.

4. The method as claimed in claim 2 wherein the deviation is based on measurement of a difference between the porosity from the first set and the porosity from the second set.

5. The method as claimed in claim 3 wherein the deviation is based on measurement of a difference between the porosity from the first set and the porosity from the second set.

6. A method as claimed in claim 4 wherein the deviation is an absolute deviation $MES^{abs}$ defined according to a formula:

$$MES^{abs} = \max_{n \in N}(|\varphi_n^g - \varphi_n^b|)$$

where $\varphi_n^b$ and $\varphi_n^g$ correspond to the porosity determined by respectively the basin simulation and the geomechanical simulation in a mesh n of the meshed representation comprising N meshes.

7. A method as claimed in claim 5 wherein the deviation is an absolute deviation $MES^{abs}$ defined according to a formula:

$$MES^{abs} = \max_{n \in N}(|\varphi_n^g - \varphi_n^b|)$$

where $\varphi_n^b$ and $\varphi_n^g$ correspond to the porosity determined by respectively the basin simulation and the geomechanical simulation in a mesh n of the meshed representation comprising N meshes.

8. A method as claimed in claim 4 wherein the deviation is a relative deviation $MES^{rel}$ defined according to a formula:

$$MES^{rel} = \frac{2 \times \max_{n \in N}(|\varphi_{n,}^g - \varphi_{n,}^b|)}{\varphi_n^g + \varphi_n^b}$$

where $\varphi_n^b$ and $\varphi_n^g$ correspond to the porosity determined by respectively the basin simulation and the geomechanical simulator in a mesh n of the meshed representation comprising N meshes.

9. A method as claimed in claim 5 wherein the deviation is a relative deviation $MES^{rel}$ defined according to a formula:

$$MES^{rel} = \frac{2 \times \max_{n \in N}(|\varphi_{n,}^g - \varphi_{n,}^b|)}{\varphi_n^g + \varphi_n^b}$$

where $\varphi_n^b$ and $\varphi_n^g$ correspond to the porosity determined by respectively the basin simulation and the geomechanical simulator in a mesh n of the meshed representation comprising N meshes.

10. The method according to claim 1 comprising simulating at least one of erosion of at least one of the layers and simulation of a geological disconformity.

11. The method according to claim 2 comprising simulating at least one of erosion of at least one of the layers and simulation of a geological disconformity.

12. The method according to claim 3 comprising simulating at least one of erosion of at least one of the layers and simulation of a geological disconformity.

13. The method according to claim 4 comprising simulating at least one of erosion of at least one of the layers and simulation of a geological disconformity.

14. The method according to claim 5 comprising simulating at least one of erosion of at least one of the layers and simulation of a geological disconformity.

15. The method according to claim 6 comprising simulating at least one of erosion of at least one of the layers and simulation of a geological disconformity.

16. The method according to claim 7 comprising simulating at least one of erosion of at least one of the layers and simulation of a geological disconformity.

17. The method according to claim 8 comprising simulating at least one of erosion of at least one of the layers and simulation of a geological disconformity.

18. The method according to claim 9 comprising simulating at least one of erosion of at least one of the layers and simulation of a geological disconformity.

* * * * *